United States Patent
Suzuki et al.

(10) Patent No.: US 9,362,896 B2
(45) Date of Patent: Jun. 7, 2016

(54) CHIP, MULTICHIP MODULE, AND APPARATUS PROVIDED WITH THE SAME

(71) Applicant: CANON KABUSHIKI KAISHA, Tokyo (JP)

(72) Inventors: Tatsuya Suzuki, Yokohama (JP); Masanobu Ohmura, Yokohama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 14/679,939

(22) Filed: Apr. 6, 2015

(65) Prior Publication Data

US 2015/0288351 A1    Oct. 8, 2015

(30) Foreign Application Priority Data

Apr. 8, 2014   (JP) .................................. 2014-079151

(51) Int. Cl.
| | |
|---|---|
| *H04N 1/04* | (2006.01) |
| *H03K 3/013* | (2006.01) |
| *B41J 29/00* | (2006.01) |
| *H04N 1/00* | (2006.01) |
| *B41J 29/393* | (2006.01) |

(52) U.S. Cl.
CPC .................. *H03K 3/013* (2013.01); *B41J 29/00* (2013.01); *B41J 29/393* (2013.01); *H04N 1/00904* (2013.01); *H04N 1/04* (2013.01)

(58) Field of Classification Search
CPC .............................. H04N 1/00904; H04N 1/04
USPC .................................. 358/474, 482, 483, 498
See application file for complete search history.

(56) References Cited

U.S. PATENT DOCUMENTS

| | | | |
|---|---|---|---|
| 5,168,153 A * | 12/1992 | Ikeda ..................... | H04N 5/335 250/214 A |
| 6,950,132 B1 | 9/2005 | Kozuka | |
| 2004/0004127 A1* | 1/2004 | Nakamura ......... | G06K 7/10851 235/462.26 |
| 2004/0252353 A1* | 12/2004 | Sano .................. | H04N 1/00681 358/474 |
| 2014/0091202 A1 | 4/2014 | Kobayashi et al. | |

FOREIGN PATENT DOCUMENTS

| | | |
|---|---|---|
| JP | H02-47980 A | 2/1990 |
| JP | 11-112728 A | 4/1999 |

OTHER PUBLICATIONS

German Search Report dated Oct. 19, 2015 in counterpart German Patent Appln No. GB1505926.4.

* cited by examiner

*Primary Examiner* — Houshang Safaipour
(74) *Attorney, Agent, or Firm* — Fitzpatrick, Cella, Harper & Scinto

(57) ABSTRACT

Provided is a chip including a plurality of unit cells; a scanning circuit adapted to scan the plurality of unit cells, thereby making each of the plurality of unit cells output a signal; a voltage-to-current conversion circuit; a current-to-voltage conversion circuit; an output terminal; and an input terminal. The current-to-voltage conversion circuit is adapted to convert a first current signal input into the input terminal, into a first voltage signal, the scanning circuit starts scanning in response to the first voltage signal output from the current-to-voltage conversion circuit, and the voltage-to-current conversion circuit is adapted to convert a second voltage signal output from the scanning circuit into a second current signal, and to output the second current signal from the output terminal.

11 Claims, 4 Drawing Sheets

CHIP, MULTICHIP MODULE, AND APPARATUS PROVIDED WITH THE SAME

BACKGROUND OF THE INVENTION

1. Field of the Invention

The present invention relates to a chip, a multichip module, and an apparatus provided with the same, and particularly relates to a multichip module in which a plurality of semiconductor chips is mounted on a mounting board.

2. Description of the Related Art

Japanese Patent Application Laid-Open No. H11-112728 discloses a contact type image sensor in which components such as a plurality of sensor chips, an amplifier chip, a capacitor and a resistor are mounted on the same board. It is described that the amplifier chip and the sensor chip are mounted on the same board, and thereby can reduce the volume of the module or a unit, due to the configuration. Furthermore, it is also described that a voltage in a reset state is clamped and is used as a reference signal, and thereby a fixed pattern noise (FPN) due to a step between chips is removed.

In the multichip module such as the contact type image sensor described in Japanese Patent Application Laid-Open No. H11-112728, wires which connect chips to each other have a parasitic capacitance between the wire and another wire or the ground. When a signal which is transmitted between the chips is a voltage signal, the variation of the voltage when the signal is transmitted and received between the chips causes charging and discharging of the parasitic capacitance, and a power supply voltage fluctuates. This fluctuation of the power supply voltage varies a reference potential in the chip, and accordingly the above described variation of the signal voltage can become a cause of the noise.

SUMMARY OF THE INVENTION

According to a first aspect of the present invention there is provided a chip including: a plurality of unit cells; a scanning circuit adapted to scan the plurality of unit cells, thereby making each of the plurality of unit cells output a signal; a voltage-to-current conversion circuit; a current-to-voltage conversion circuit; an output terminal; and an input terminal. The current-to-voltage conversion circuit is adapted to convert a first current signal input into the input terminal, into a first voltage signal, the scanning circuit starts scanning in response to the first voltage signal output from the current-to-voltage conversion circuit, and the voltage-to-current conversion circuit is adapted to convert a second voltage signal output from the scanning circuit into a second current signal, and to output the second current signal from the output terminal.

Further features of the present invention will become apparent from the following description of exemplary embodiments with reference to the attached drawings.

DESCRIPTION OF THE EMBODIMENTS

Preferred embodiments of the present invention will now be described in detail in accordance with the accompanying drawings.

First Embodiment

Figure 1:
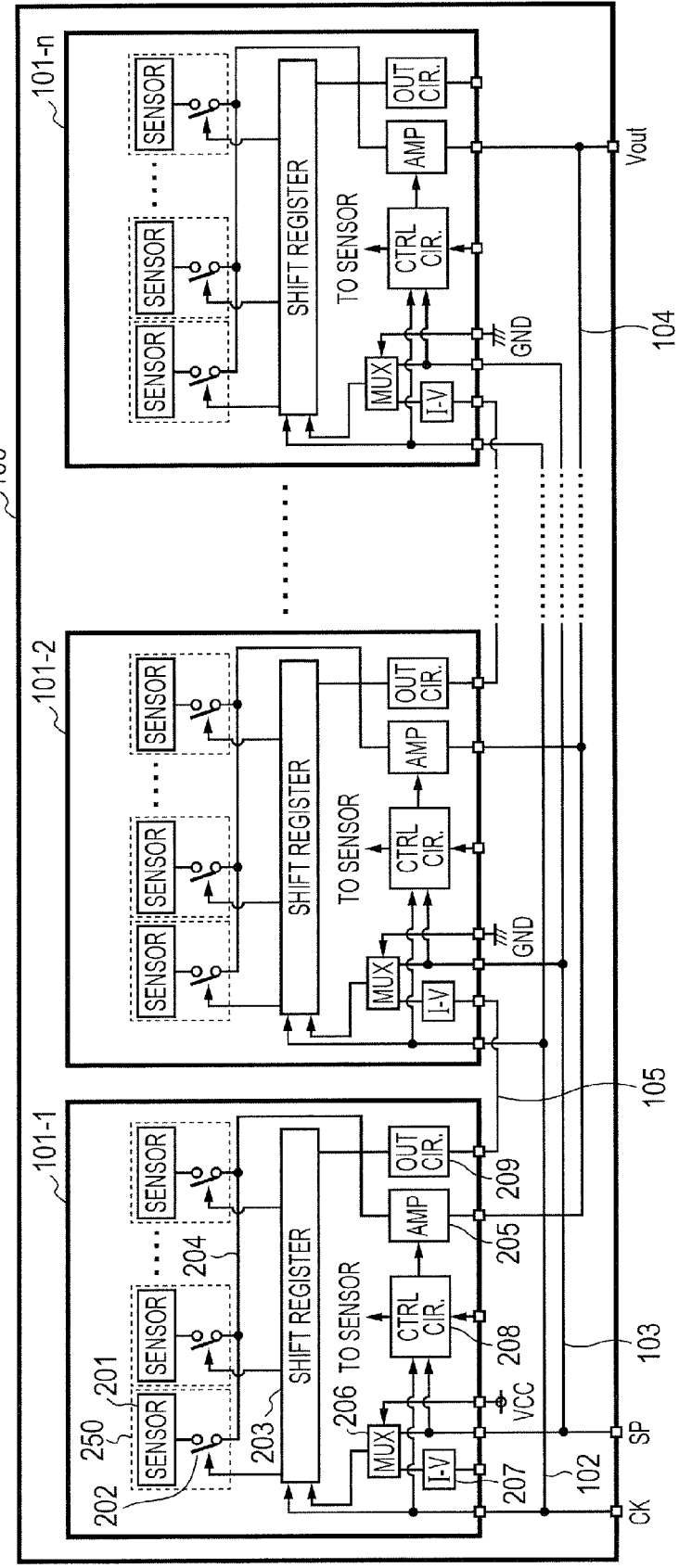
FIG. 1 is a view illustrating a configuration of a multichip module according to a first embodiment.

FIG. 1 is a view illustrating a configuration of a multichip module according to a first embodiment of the present invention. The multichip module 100 includes a plurality of pieces (n pieces) of semiconductor chips 101-1, 101-2 to 101-$n$ which are mounted on a mounting board 106. The mounting board 106 is formed of a printed circuit board and the like, and has electrodes for mounting the semiconductor chips and connecting wires.

The semiconductor chips 101-1, 101-2 to 101-$n$ are cascade-connected by respective wires on the mounting board 106, in order of a branch number of the reference numeral. Specifically, a control signal which is output from the semiconductor chip 101-1 is input into the semiconductor chip 101-2, and a control signal which is output from the semiconductor chip 101-2 is input into the semiconductor chip 101-3. Incidentally, a chip which is used in each embodiment of the present invention is not limited to a chip of a semiconductor, and the present invention can be applied to a module on which components having various chip forms are mounted.

The multichip module 100 further includes an input terminal into which a clock signal CK and a start signal SP are input from the outside, and an output terminal which outputs a sensor output signal Vout to the outside. A clock signal wire 102, a start signal wire 103, a sensor output signal wire 104 and control signal lines 105 are formed on the mounting board 106. The clock signal CK and the start signal SP are input into the semiconductor chips 101-1 to 101-$n$, through the clock signal wire 102 and the start signal wire 103, respectively. The sensor output signals Vout which are output from the semiconductor chips 101-1 to 101-$n$ are connected to the output terminal through the sensor output signal wire 104. A control signal which is output from a semiconductor chip 101-$i$ is connected to the next semiconductor chip 101-($i$+1) through the control signal line 105.

Each of the semiconductor chips 101-1 to 101-$n$ includes a plurality of photo-sensors 201, a plurality of switching circuits 202, a shift register 203 having N bits, a sensor output circuit 205, a start signal selection circuit 206, a current-to-voltage conversion circuit 207, a control circuit 208 and a control signal output circuit 209.

The photo-sensor 201 is a photoelectric conversion part including a photodiode. The output from each of the photo-sensors 201 is connected to a sensor output line 204 through each of the switching circuits 202, and is made to be common. The ON (conductive)/OFF (non-conductive) state of the switching circuit 202 is controlled by a control signal which is output from a shift register 203. The sensor output line 204 is connected to the sensor output circuit 205, and the sensor output circuit 205 subjects its input signal to processing such as amplification, and outputs the processed signal to the sensor output signal wire 104. The sensor output circuit 205 is an amplifier which is formed of, for instance, a transistor and the like. The clock signal CK and the output signal of the start signal selection circuit 206 are input into the shift register 203. The photo-sensor 201 is a light-receiving part which outputs a signal based on incident light, in the present embodiment. In addition, the sensor output circuit 205 is an output part which outputs a signal based on the signal that has been output from the light-receiving part, to the outside of the semiconductor chip 101, in the present embodiment. Each of the unit cells 250 has the photo-sensor 201 and the switching circuit 202. The shift register 203 is a scanning circuit in the present embodiment.

The start signal selection circuit 206 is a selection circuit such as a multiplexer, and has two signal input terminals, a selection control terminal and an output terminal. The start signal selection circuit 206 selects any one of the signals which are input into the two signal input terminals, in response to a signal voltage that is input into the selection control terminal, and outputs the selected signal from the output terminal. An output signal from the current-to-voltage conversion circuit 207 and the start signal SP are input into the input terminals of the start signal selection circuit 206. Any one of a power supply voltage VCC and a ground potential GND is input as the selection control signal, into the selection control terminal of the start signal selection circuit 206. The power supply voltage VCC is input into the selection control terminal of the start signal selection circuit 206 in the semiconductor chip 101-1 which is the first chip. At this time, the start signal SP is output from the output terminal of the start signal selection circuit 206. The ground potential GND is connected to the selection control terminal in each of the semiconductor chips 101-2 to 101-n which are second and subsequent chips. At this time, the output signal of the current-to-voltage conversion circuit 207 is output from the output terminal of the start signal selection circuit 206.

The clock signal CK and the start signal SP are input into the control circuit 208. The control circuit 208 outputs a signal for controlling an operation, to the plurality of photo-sensors 201 and the sensor output circuit 205, in response to these input signals. The control circuit 208 controls the reset timing of an electric charge in the photodiode of each of the photo-sensors 201. In addition, the control circuit 208 controls an accumulation period of the photo-sensor 201.

The output value of the (N−2)-th bit of the shift register 203 is input into the control signal output circuit 209. The output signal from the control signal output circuit 209 is connected to a current-to-voltage conversion circuit 207 in the next semiconductor chip, through the control signal line 105. The output signal from the control signal output circuit 209 in the semiconductor chip 101-1 is a voltage signal which shows the start timing for the scan of the shift register 203 in the semiconductor chip 101-2.

Figure 2:
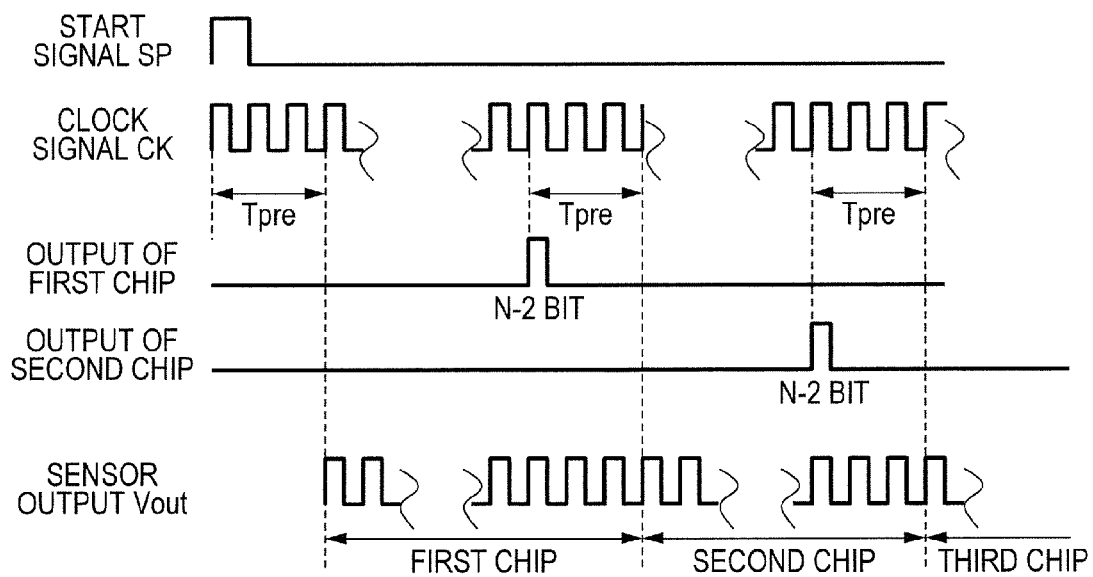
FIG. 2 is an operation timing chart of the multichip module according to the first embodiment.

FIG. 2 is a timing chart of the multichip module according to the first embodiment. As described above, in the first semiconductor chip 101-1, the start signal selection circuit 206 outputs the start signal SP to the shift register 203. When the start signal SP becomes a high level in the state in which the clock signal CK is input into the shift register 203, the control circuit 208 controls the sensor output circuit 205 so as to prepare for the readout of the signals from the photo-sensor 201 and for an operation of the sensor output circuit 205. These preparations are performed in a Tpre period which is a period of the first several bits (hereinafter set at 3 bits) of the clock signal CK. After the Tpre period has passed, each of the switching circuits 202 is sequentially controlled to a conductive state by the pulse of the clock signal output from the shift register 203. Thereby, the output signals from the photo-sensors 201 in the first chip are output to the sensor output signal wire 104 through the sensor output circuit 205. At the timing of the output of the (N−2)-th bit signal, the shift register 203 switches the (N−2)-th switching circuit 202 to the conductive state, and also outputs the clock signal to the control signal output circuit 209. In other words, the clock signal is output to the current-to-voltage conversion circuit 207 in the next semiconductor chip through the control signal line 105, before the photo-sensor 201 in the first chip ends the operation of outputting the signal to the sensor output signal wire 104.

In the second semiconductor chip 101-2, the start signal selection circuit 206 selects the output signal from the control signal output circuit 209 in the previous semiconductor chip, and outputs the selected signal. When a high level interval of the output signal from the control signal output circuit 209 is input, a preparation for the operation is performed in a Tpre period of three bits, similarly to that in the first semiconductor chip 101-1. This control is suitable when an electric current consumption in the sensor output circuit 205 in the second semiconductor chip 101-2 is reduced until the time of an operation that the sensor output circuit 205 outputs a signal based on the signal which is output from the photo-sensor 201. A predetermined period is needed from the state in which the electric current consumption of the sensor output circuit 205 in the second semiconductor chip 101-2 is reduced, to the state in which the sensor output circuit 205 is returned so as to be capable of outputting the signal based on the signal that is output from the photo-sensor 201. In the control illustrated in FIG. 2, the sensor output circuit 205 can be returned from the state in which the electric current consumption of the sensor output circuit 205 is reduced, in the Tpre period. Thereby, a period can be shortened which is needed after the first semiconductor chip 101-1 has ended the operation of outputting the signal to the sensor output signal wire 104 before the second semiconductor chip 101-2 starts the operation of outputting the signal to the sensor output signal wire 104. After the Tpre period has passed, each of the switching circuits 202 is sequentially controlled to a conductive state by the pulse of the clock signal of the shift register 203, and the output signals from the photo-sensors 201 in the second chip are output to the sensor output signal wire 104 through the sensor output circuit 205. Accordingly, the start timing for the scan of the shift register 203 in the semiconductor chip 101-2 is controlled, in response to the output signal from the control signal output circuit 209 in the semiconductor chip 101-1. The operations in the third and subsequent semiconductor chips are similar to that in the second chip, and accordingly will be omitted. Thus, the output signals from the sensors are sequentially read out from the semiconductor chips 101-1 to 101-n.

Figure 3:
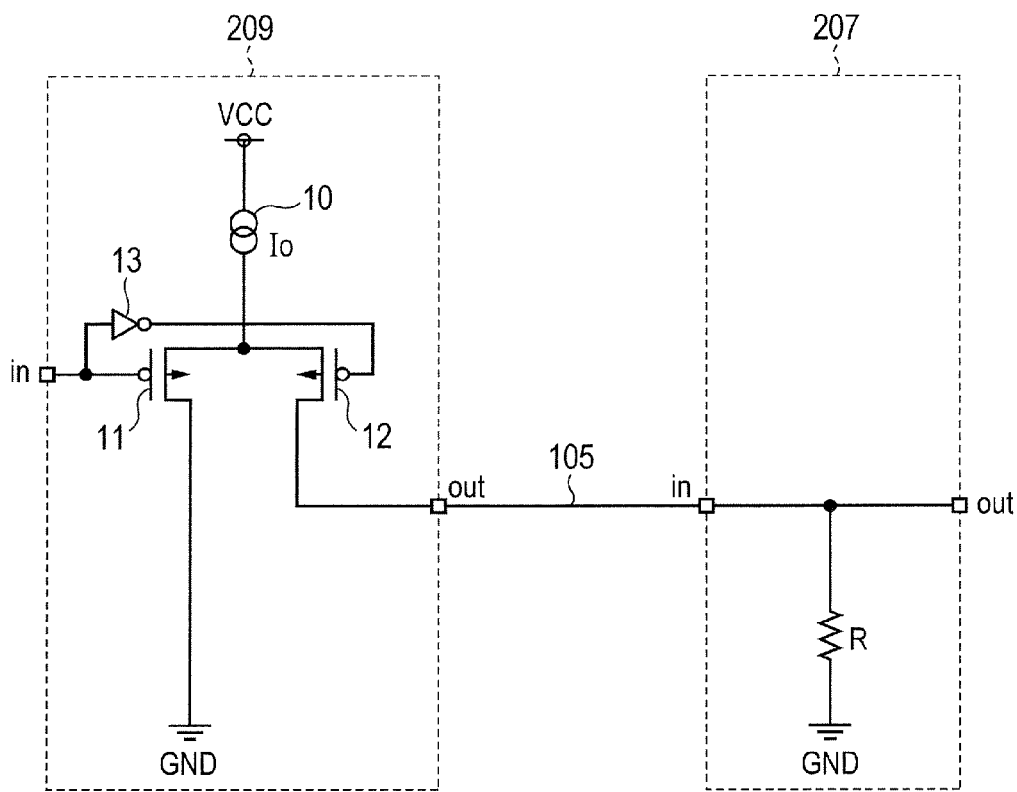
FIG. 3 is a view illustrating a configuration and connection of a control signal output circuit and a current-to-voltage conversion circuit according to the first embodiment.

FIG. 3 is a view illustrating circuit configurations of and connection relationship of a control signal output circuit 209 and a current-to-voltage conversion circuit 207 over two semiconductor chips. The control signal output circuit 209 includes a constant current circuit 10, transistors 11 and 12, and an inverter circuit 13. The power supply voltage VCC is input into the constant current circuit 10, and the constant current circuit 10 outputs a constant current Io. The transistors 11 and 12 are P-type MOS transistors. The inverter circuit 13 is a circuit which inverts the input voltage level (high level or low level), and outputs the inverted voltage level.

The output terminal of the constant current circuit 10 is connected to the source terminals of the transistors 11 and 12 which are commonly connected to each other. The transistors 11 and 12 form a differential pair. The drain terminal of the transistor 11 is connected to a ground terminal GND. The drain terminal of the transistor 12 is connected to an output terminal "out" of the control signal output circuit 209, and the gate terminal of the transistor 11 is connected to an input terminal "in" of the control signal output circuit 209. The output signal of the shift register 203 is input into the input terminal "in". The output signal of the shift register 203 is input into the gate terminal of the transistor 12 through the inverter circuit 13. Specifically, the voltage level of the signal which is input into the gate terminal of the transistor 12 becomes a voltage level in which the voltage level of the output signal of the shift register 203 is inverted.

The current-to-voltage conversion circuit 207 includes a wire which connects an input terminal "in" and an output terminal "out", and a resistor R which is connected in between this wire and the ground terminal GND. The input terminal "in" of the current-to-voltage conversion circuit 207 is connected to the output terminal "out" of the control signal output circuit 209. The output terminal "out" of the current-to-voltage conversion circuit 207 is connected to a start signal selection circuit 206.

When the output voltage from the shift register 203 is in a low level, the voltage of the gate terminal of the transistor 11 is in a low level, and the voltage of the gate terminal of the transistor 12 is in a high level. At this time, the transistor 11 is in an ON state, and the transistor 12 is in an OFF state. Accordingly, an electric current flows from the constant current circuit 10 to the ground terminal GND through the transistor 11, and the electric current does not flow to the transistor 12.

After that, when the high-level signal for the (N−2)-th bit is input from the shift register 203, the voltage of the gate terminal of the transistor 11 becomes a high level, and the voltage of the gate terminal of the transistor 12 becomes a low level. Thereby, the transistor is turned OFF, and the transistor 12 is turned ON. Therefore, the constant current Io is output from the output terminal "out" of the control signal output circuit 209. As in the above description, the control signal output circuit 209 functions as a voltage-to-current conversion circuit which switches the output of the constant current Io between the presence and the absence, according to the level of the voltage which has been input into the input terminal "in".

The constant current Io is input into the input terminal "in" of the current-to-voltage conversion circuit 207. If the output resistance of the current-to-voltage conversion circuit 207 is assumed to be sufficiently high, the constant current Io flows into the resistor R. At this time, the voltage of the output terminal "out" of the current-to-voltage conversion circuit 207 becomes Io×R. Accordingly, the current-to-voltage conversion circuit 207 converts the input current signal into the voltage signal, and outputs the voltage signal. Incidentally, in the present specification, "current signal" shall mean a signal of which the information is transmitted according to a level of a current value, and "voltage signal" shall mean a signal of which the information is transmitted according to a level of a voltage value.

In the multichip module in which the signals are transmitted between the chips, there can exist a parasitic capacitance between the wire in between the chips and the signal line or the ground. When the voltage of the wire in between the chips changes from the ground potential GND to the power supply voltage VCC, or from the power supply voltage VCC to the ground potential GND, the parasitic capacitance is charged and discharged. This charging and discharging cause a fluctuation in the power supply voltage VCC or the ground potential GND, and accordingly a fluctuation can occur in the potential of the circuit in the photo-sensor 201, the reference voltage of the sensor output circuit 205, and the like. When the multichip module 100 is operated and outputs the signal in this state, the influence of the potential fluctuation occasionally appears in a form of a fixed pattern noise.

In contrast to this, in the configuration shown in the present embodiment, the control signal output circuit 209 outputs the constant current, and accordingly the voltage fluctuation which is caused by the charging and discharging of the parasitic capacitance is reduced. Thereby, the sensor output signal can be obtained in which the occurrence of the fixed pattern noise is reduced.

Incidentally, the control signal output circuit 209 illustrated in FIG. 3 and its description may have a configuration in which a bipolar transistor is used in place of the MOS transistor. The resistor R of the current-to-voltage conversion circuit 207 can have various forms such as a wiring resistor which employs a metal wire, a diffusion resistor which is due to a diffusion layer, disposed over a well region, having a higher impurity concentration than that in the well region of a semiconductor substrate, and a resistor which is due to polysilicon provided on an oxide film on the semiconductor substrate. The current-to-voltage conversion circuit 207 is not limited to the current-to-voltage conversion circuit by the resistor R, and for instance, may employ a current-to-voltage conversion circuit which uses a transistor.

In addition, in the present embodiment, an example has been described in which the scanning circuit is the shift register, but the scanning circuit may be a decoder.

Second Embodiment

Figure 4:
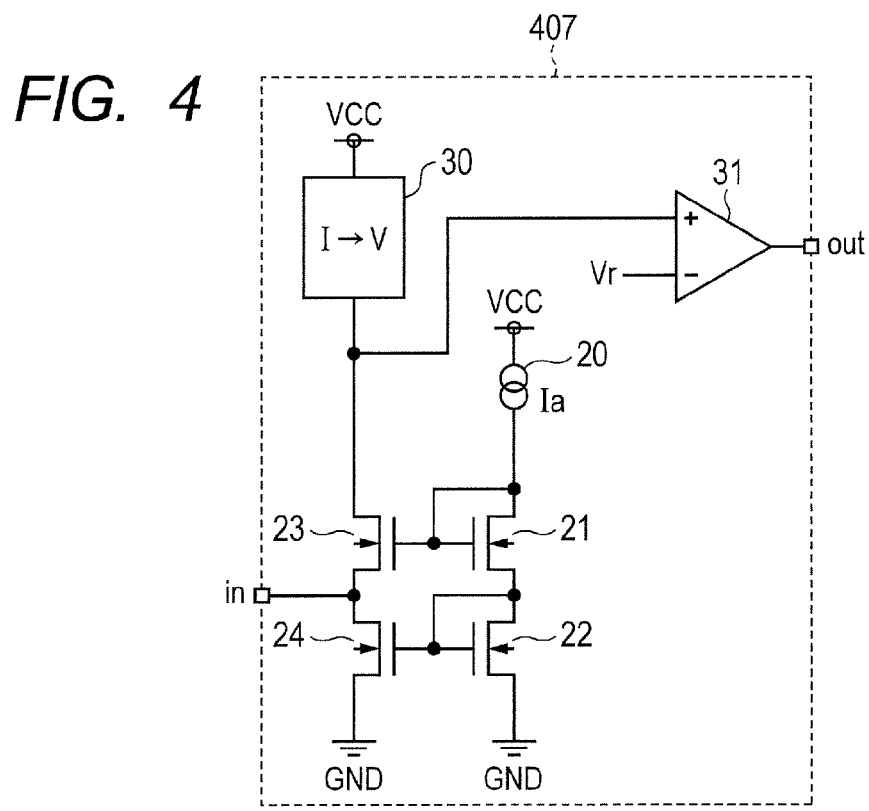
FIG. 4 is a view illustrating a configuration of a current-to-voltage conversion circuit according to a second embodiment.

FIG. 4 is a view illustrating a configuration of a current-to-voltage conversion circuit according to a second embodiment. The current-to-voltage conversion circuit 407 includes a constant current source 20, transistors 21, 22, 23 and 24, a current-to-voltage conversion portion 30 and a comparator 31.

The constant current source 20 is a circuit which supplies a fixed current value Ia. The current value Ia is desirably larger than the current value Io which is output from the control signal output circuit 209.

The transistors 21, 22, 23 and 24 are N-type MOS transistors. The transistors 21, 22, 23 and 24 form a cascode type current mirror circuit. A drain terminal and a gate terminal of the transistor 21 are made to be common, and are connected to a current output terminal of the constant current source 20. A drain terminal and a gate terminal of the transistor 22 are made to be common, and are connected to a source terminal of the transistor 21 and a gate terminal of the transistor 24. A source terminal of the transistor 22 is connected to the ground terminal GND. A gate terminal of the transistor 23 is connected to the gate terminal of the transistor 21. A drain terminal of the transistor 24 is connected to a source terminal of the transistor 23. A source terminal of the transistor 24 is connected to the ground terminal GND. A connecting point between the source terminal of the transistor 23 and the drain terminal of the transistor 24 is an input terminal "in" of the current-to-voltage conversion circuit 407. The input terminal "in" of the current-to-voltage conversion circuit 407 is connected to the output terminal "out" of the control signal output circuit 209 through the control signal line 105.

A drain terminal of the transistor 23 is connected to one end of the current-to-voltage conversion portion 30, and a non-inverting input terminal of the comparator 31. The other end of the current-to-voltage conversion portion 30 is connected to a power supply voltage VCC. The current-to-voltage conversion portion 30 is a circuit in which a voltage to be output varies in response to an electric current that flows from the power supply voltage VCC toward the ground terminal GND. The current-to-voltage conversion portion 30 can be formed of, for instance, a resistor R. The resistor R can have the same structure as that of the resistor R described in the first embodiment. A reference voltage Vr is input into an inverting input terminal of the comparator 31. The output terminal of the comparator 31 becomes an output terminal "out" of the current-to-voltage conversion circuit 407. When the voltage which is input into the non-inverting input terminal of the comparator 31 is larger than the reference voltage Vr, an output voltage becomes a high level, and when the voltage is smaller than the reference voltage Vr, the output voltage becomes a low level.

A size ratio among the transistors shall be set so that when the constant current Ia is supplied to the transistor 22 from the constant current source 20, the constant current Ia also flows to the transistor 24. At this time, an electric current which is input into the current-to-voltage conversion circuit 407 from the control signal output circuit 209 is any one of Io and zero. Accordingly, an electric current which flows into the drain terminal of the transistor 23 from the power supply voltage VCC through the current-to-voltage conversion portion 30 is any one of an electric current (Ia−Io) and an electric current Ia. When the electric current (Ia−Io) flows, the current-to-voltage conversion portion 30 shall output a larger voltage than the reference voltage Vr, and when the electric current Ia flows, the current-to-voltage conversion portion 30 shall output a smaller voltage. In this case, when the input current is Io, the output voltage of the current-to-voltage conversion circuit 407 becomes a high level, and when the input current is zero, the output voltage of the current-to-voltage conversion circuit 407 becomes a low level. According to the above described way, the current-to-voltage conversion circuit 407 performs the current-voltage conversion operation of outputting any one of a high voltage and a low voltage in response to the input current.

In the first embodiment, a transmission speed (frequency characteristic) of signals is determined depending on a time constant which is determined by a resistance value R of the current-to-voltage conversion circuit 207 and a parasitic capacitance of the wire in between the chips, and on a current value Io that is output from the control signal output circuit 209. In order to transmit signals at high speed, it is necessary to decrease the resistance value of the current-to-voltage conversion circuit 207 and decrease the time constant. When the resistance value of the current-to-voltage conversion circuit 207 is decreased, it is necessary to increase the current value which is output from the control signal output circuit 209, in order to keep the output voltage constant. Accordingly, in order to transmit signals at high speed, it is necessary to increase the output current, and electric current consumption increases.

On the other hand, in the present embodiment, the electric current is supplied so that a voltage between the drain and the source of the transistor 24 becomes constant due to the cascode type current mirror circuit, in the current-to-voltage conversion circuit 407. Because of this, when the input current is any one of Io and zero, the voltage of the input terminal becomes almost constant, and the influence of the above described parasitic capacitance is reduced. When the influence of the parasitic capacitance is reduced, the time constant is thereby decreased, and accordingly signals can be transmitted at high speed. In addition, by the above described reason, it becomes unnecessary to increase the current value which is output from the control signal output circuit 209, for the high-speed transmission, and the electric current consumption can be reduced. Accordingly, the present embodiment can reduce the electric current consumption and achieve the increase of the speed of the signal transmission, in addition to the effect shown in the first embodiment.

Third Embodiment

Figure 5:
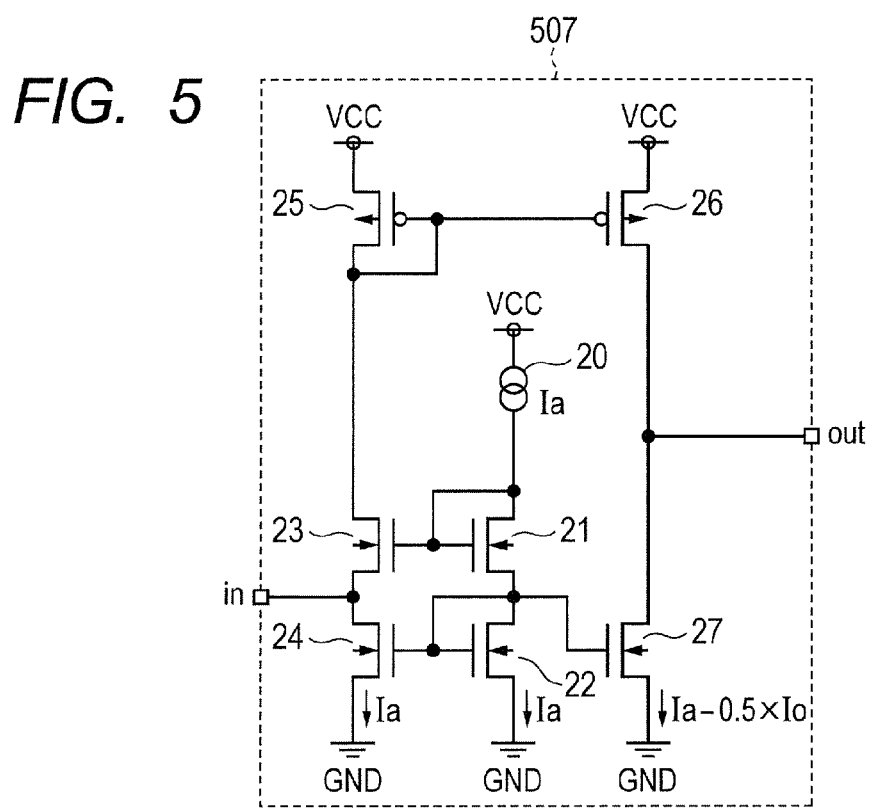
FIG. 5 is a view illustrating a configuration of a current-to-voltage conversion circuit according to a third embodiment.

FIG. 5 is a view illustrating a configuration of a current-to-voltage conversion circuit according to a third embodiment. The current-to-voltage conversion circuit 507 includes a constant current source 20, and transistors 21 to 27. The configurations of the constant current source 20 and the transistors 21 to 24 are similar to those in the second embodiment, and accordingly the description will be omitted.

The transistors 25 and 26 are P-type MOS transistors, and the transistor 27 is an N-type MOS transistor. Source terminals of the transistors 25 and 26 are connected to power supply voltages VCC, respectively. A gate terminal and a drain terminal of the transistor 25 are made to be common, and are connected to a drain terminal of the transistor 23 and a gate terminal of the transistor 26. Accordingly, the transistors 25 and 26 form a current mirror circuit. A drain terminal of the transistor 26 is connected to a drain terminal of the transistor 27, and this connecting point becomes an output terminal "out" of the current-to-voltage conversion circuit 507. A source terminal of the transistor 27 is connected to the ground potential GND, and a gate terminal of the transistor 27 is connected to a gate terminal of the transistor 22 and 24. Accordingly, the transistors 22, 24 and 27 form a current mirror circuit. A dimensional ratio among the transistors is set so that the electric currents which flow in the transistors 22, 24 and 27 become Ia, Ia, and (Ia−0.5×Io), respectively. In addition, a dimensional ratio between the transistors is set so that electric currents which flow in the transistors 25 and 26 become the same.

As has been described in the description of the second embodiment, the electric current which is input into the current-to-voltage conversion circuit 507 is any one of Io or zero. Accordingly, the electric current which flows into the drain terminal of the transistor 23 from the power supply voltage VCC through the transistor 25 becomes any one of an electric current (Ia−Io) and an electric current Ia. As has been described above, a drain current of the transistor 26 is the same as a drain current of the transistor 25, and accordingly is any one of the electric current (Ia−Io) and the electric current Ia. In addition, a drain current of the transistor 27 does not depend on the input current of the current-to-voltage conversion circuit 507, and becomes a constant value of (Ia−0.5×Io).

Accordingly, when the output current from the control signal output circuit 209 is zero, the drain current of the transistor 26 is Ia, and the drain current of the transistor 27 is (Ia−0.5×Io). Accordingly, an electric current (0.5Io) is output from the output terminal "out". On the other hand, when the output current from the control signal output circuit 209 is Io, the drain current of the transistor 26 is (Ia−Io), and the drain current of the transistor 27 is (Ia−0.5×Io). Accordingly, an electric current (−0.5Io) is output from the output terminal "out". When a circuit (unillustrated) which outputs any one of a high voltage and a low voltage according to the value of the output current is connected to the terminal "out", the current-to-voltage conversion is thereby achieved which outputs any one of a high voltage and a low voltage in response to the input current. Such the circuit as to output any one of the high voltage and the low voltage can be the same as, for instance, the current-to-voltage conversion circuit 207 which has been described in the first embodiment.

The third embodiment can reduce the electric current consumption and can achieve the increase of the speed of the signal transmission, similarly to the second embodiment. Furthermore, the third embodiment eliminates the need for the comparator 31 and the circuit which supplies the reference voltage Vr in the second embodiment, and accordingly can reduce the element area compared to the second embodiment, and the multichip module can be miniaturized. Furthermore, the number of the semiconductor chips which can be manufactured from one semiconductor wafer increases due to the reduction of the element area, and accordingly a manufacturing cost is reduced.

Fourth Embodiment

In the first to third embodiments, a multichip module 100 has been described which uses a plurality of semiconductor chips 101-1 to 101-n.

Figure 6:
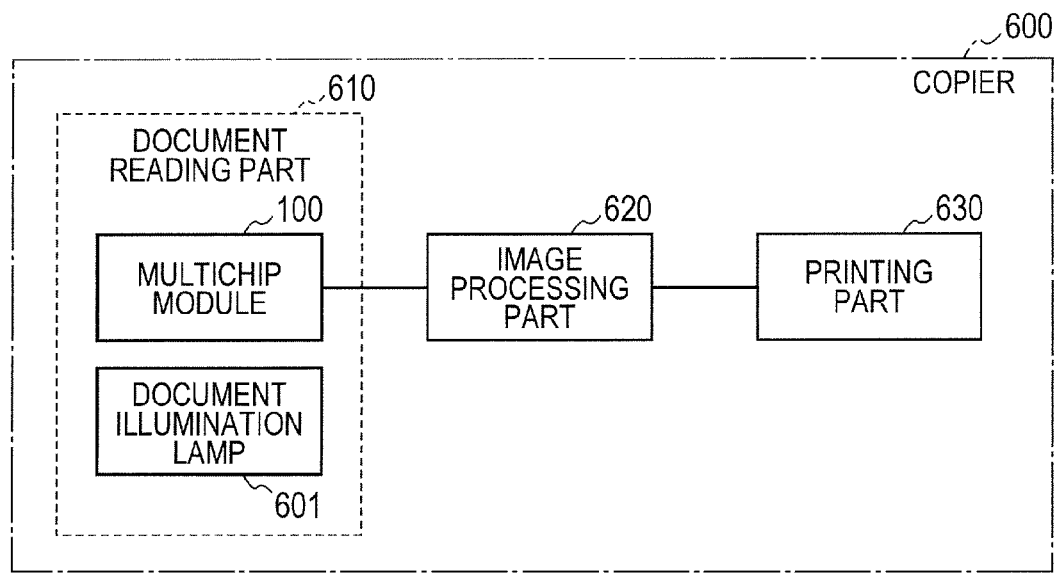
FIG. 6 is a block diagram illustrating a configuration of a copier according to a fourth embodiment.

In the fourth embodiment, the multichip module 100 is used as a line sensor for a document reading part of a copier. FIG. 6 is a block diagram illustrating a configuration of a copier according to a fourth embodiment. A copier 600 includes the document reading part 610, an image processing part 620 and a printing part 630. The document reading part 610 in the present exemplary embodiment is one example of the image reading part which generates signals based on an image. The document reading part 610 includes a document illumination lamp 601, and the multichip module 100 according to the first to third embodiments. The document illumination lamp 601 irradiates the document to be copied with light for reading. The light which has been reflected from the document is incident on a plurality of photo-sensors 201 that are arrayed in the multichip module 100. The multichip module 100 makes the image processing part 620 of the copier 600 acquire image signals according to the quantity of light which has been incident on each of the photo-sensors 201. The copier 600 repeats the above described operation of acquiring the image signals, while scanning the document by relatively moving the positions of the document reading part 610 and the document to each other. Thus, the image processing part 620 acquires the image signals of the whole surface of the document. The printing part 630 copies the document onto a print medium such as paper, based on the image signals of the document, which the image processing part 620 has acquired. The fixed pattern noise is reduced in the signals which are acquired by the multichip module 100 according to the first to third embodiments. Because the noise appearing when the document is read out is reduced, the copier according to the present embodiment enables a copy showing little noise. Incidentally, in the present embodiment, the copier 600 has been illustrated which has the multichip module 100 in the document reading part 610, but the embodiments of the present invention can be similarly applied to various apparatuses having a reading function as well. The present embodiment can be widely applied to, for instance, apparatuses including an image reading apparatus, such as a scanner and an inspection apparatus, in addition to the copier.

Fifth Embodiment

Figure 7:
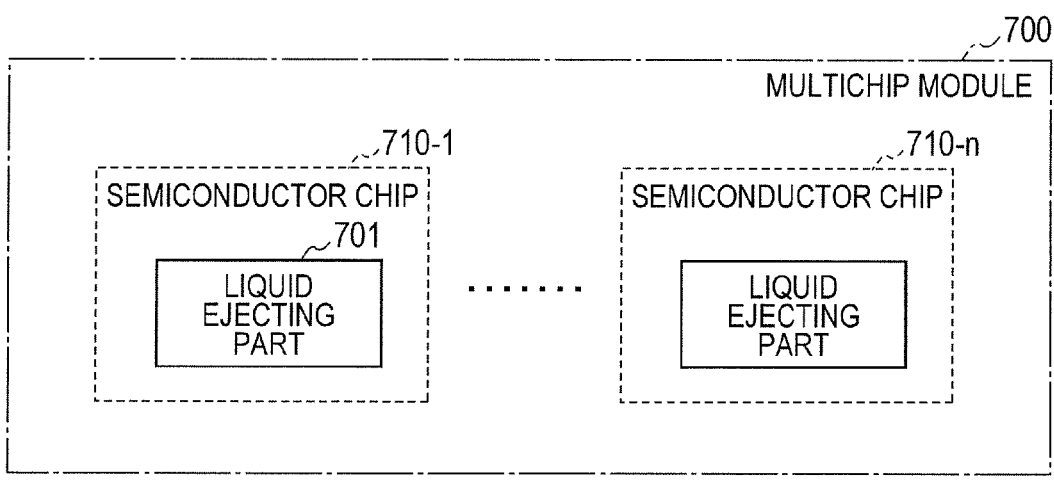
FIG. 7 is a block diagram illustrating a configuration of a multichip module according to a fifth embodiment.

FIG. 7 is a block diagram illustrating a configuration of a multichip module according to a fifth embodiment. The multichip module 100 in the first to third embodiments is an apparatus which includes semiconductor chips 101-1 to 101-n including the photo-sensors 201. On the other hand, semiconductor chips 710-1 to 710-n of a multichip module 700 in the present embodiment have liquid ejecting parts 701, respectively, in place of the photo-sensors 201. In FIG. 7, a plurality of liquid ejecting parts 701 which one semiconductor chip 710 has is collectively illustrated as one liquid ejecting part 701. Each of the liquid ejecting parts 701 includes an unillustrated liquid flow channel, a liquid ejecting port, an ejection energy generating part and the like. A liquid to be ejected such as ink is supplied to the inside of the liquid flow channel. The ejection energy generating part includes an electrothermal conversion element such as a resistor of which the temperature rises by an electric current. When heat is generated in the ejection energy generating part by the electric current passed from the outside, the liquid in the liquid flow channel is heated and expands, and a droplet is ejected from the liquid ejecting port. In addition, the semiconductor chip 710 has a scanning circuit which scans each of the ejection energy generating parts of the plurality of liquid ejecting parts 701. The multichip module 700 of the present embodiment can be used in an apparatus such as a liquid ejection head. The liquid ejection head can be applied to, for instance, a liquid ejection recording apparatus such as a printer which includes a print medium feeding part that feeds a print medium such as paper. In addition, the liquid ejection head can be applied to a manufacturing apparatus which manufactures a structure such as a DNA chip, an organic transistor and a color filter, by ejecting a liquid to a structure which is being formed. In the multichip module 700 according to the present embodiment, the generation of the fixed pattern noise is reduced. Accordingly, a liquid ejection head which employs the multichip module 700 according to the present embodiment can stably eject a droplet. Incidentally, the ejection energy generating part in the present embodiment may be an ejection energy generating part that uses an electromechanical conversion element such as a piezoelectric element, which is deformed by applied voltage and thereby ejects a liquid.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-079151, filed Apr. 8, 2014, which is hereby incorporated by reference herein in its entirety.

What is claimed is:

1. A chip comprising:
a plurality of unit cells; a scanning circuit adapted to scan the plurality of unit cells, thereby making each of the plurality of unit cells output a signal; a voltage-to-current conversion circuit; a current-to-voltage conversion circuit; an output terminal; and an input terminal, wherein
the current-to-voltage conversion circuit is adapted to convert a first current signal input into the input terminal, into a first voltage signal,
the scanning circuit starts scanning in response to the first voltage signal output from the current-to-voltage conversion circuit, and
the voltage-to-current conversion circuit is adapted to convert a second voltage signal output from the scanning circuit into a second current signal, and to output the second current signal from the output terminal.

2. A multichip module comprising:
a first chip and a second chip each of which includes: a plurality of unit cells; a scanning circuit which is adapted to scan the plurality of unit cells, thereby making each of the plurality of unit cells output a signal; a voltage-to-current conversion circuit; a current-to-voltage conversion circuit; an output terminal; and an input terminal, wherein the voltage-to-current conversion circuit in the first chip is adapted to convert a first voltage signal which shows start timing for a scan of the scanning circuit in the second chip into a current signal, the output terminal of the first chip being connected to the input terminal of the second chip, such that said current signal is passed to the input terminal of the second chip, the current-to-voltage conversion circuit in the second chip is adapted to convert the current signal, which is input into the input terminal of the second chip, into a second voltage signal, and the scanning circuit in the second chip is adapted to start scanning of the plurality of unit cells in the second chip, based on the second voltage signal which has been provided by the current-to-voltage conversion circuit in the second chip.

3. The multichip module according to claim 2, wherein each of the first chip and the second chip has an output part which outputs a signal based on the signals that have been output from the plurality of unit cells, to an outside of each chip, and the current signal which the first chip outputs is a signal that is output from the output terminal of the first chip before the output part in the first chip ends an operation of outputting the signal to the outside of the chip.

4. The multichip module according to claim 3, wherein the output part of the second chip is adapted to start the operation, based on the second voltage signal which has been provided by the current-to-voltage conversion circuit in the second chip.

5. The multichip module according to claim 4, wherein the output part is an amplifier which outputs an amplified signal of the signal that has been output from each of the plurality of unit cells.

6. The multichip module according to claim 4, wherein each of the plurality of unit cells has a light-receiving part which outputs a signal based on incident light, and the output part outputs an amplified signal of the signal that has been output from each of the light-receiving parts in the plurality of unit cells.

7. An apparatus comprising an image reading part which includes the multichip module according to claim 2.

8. A copier comprising:

a document reading part including the multichip module according to claim 2, which generates an image signal based on a document by being relatively scanned to the document; and a printing part which copies the document onto a print medium based on the image signal.

9. An apparatus which has a multichip module comprising: a first chip and a second chip each of which includes: a plurality of unit cells including a liquid ejecting part; a scanning circuit which is adapted to scan the plurality of unit cells, and thereby makes each of the plurality of unit cells input a signal; a voltage-to-current conversion circuit; a current-to-voltage conversion circuit; an output terminal; and an input terminal, wherein the voltage-to-current conversion circuit in the first chip is adapted to convert a first voltage signal which shows start timing for a scan of the scanning circuit in the second chip, into a current signal, the output terminal of the first chip being connected to the input terminal of the second chip, such that said current signal is passed to the input terminal of the second chip, the current-to-voltage conversion circuit in the second chip is adapted to convert the current signal which is input into the input terminal of the second chip, into a second voltage signal, and the scanning circuit in the second chip is adapted to start scanning of the plurality of unit cells in the second chip, based on the second voltage signal which has been provided by the current-to-voltage conversion circuit in the second chip.

10. A printer comprising: the apparatus according to claim 9 and a print medium feeding part which is adapted to feed a print medium, wherein the printer is adapted to print an image on the print medium by using the apparatus.

11. A manufacturing apparatus comprising the apparatus according to claim 9, wherein the apparatus is adapted to eject a liquid to a structure which is being formed, thereby manufacturing the structure.

* * * * *